(12) United States Patent
Spruit et al.

(10) Patent No.: US 11,828,594 B2
(45) Date of Patent: Nov. 28, 2023

(54) LASER SENSOR MODULE FOR SELF-MIXING INTERFEROMETRY

(71) Applicant: TRUMPF Photonic Components GmbH, Ulm (DE)

(72) Inventors: Hans Spruit, Waalre (NL); Jochen Hellmig, Valkenswaard (NL); Alexander Marc Van der Lee, Venlo (NL); Jeroen Dragt, Veldhofen (NL); Pieter Hoeven, Meierijstad Schijndel (NL)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 178 days.

(21) Appl. No.: 17/472,747

(22) Filed: Sep. 13, 2021

(65) Prior Publication Data

US 2022/0082369 A1 Mar. 17, 2022

(30) Foreign Application Priority Data

Sep. 15, 2020 (EP) ..................................... 20196234

(51) Int. Cl.
*H01S 5/00* (2006.01)
*G01B 9/02* (2022.01)

(52) U.S. Cl.
CPC ........ *G01B 9/02092* (2013.01); *H01S 5/0028* (2013.01)

(58) Field of Classification Search
CPC ............ G01B 9/02092; G01B 9/02007; G01B 9/02012; G01B 9/02019; G01B 11/028; H01S 5/0028; H01S 5/18341; H01S 5/18361; H01S 5/4087; H01S 5/423; H01S 5/0239; H01S 5/0262; H01S 5/0427
See application file for complete search history.

(56) References Cited

U.S. PATENT DOCUMENTS

| 10,012,797 B1 * | 7/2018 | Nagarajan ............. H01S 5/1221 |
| 2005/0196177 A1 * | 9/2005 | Moran ................. H04B 10/504 398/182 |
| 2007/0091295 A1 | 4/2007 | Xu et al. |

(Continued)

FOREIGN PATENT DOCUMENTS

EP          3651290 A1      5/2020

*Primary Examiner* — Jonathan M Hansen
(74) *Attorney, Agent, or Firm* — LEYDIG VOIT & MAYER LTD.

(57) ABSTRACT

A laser sensor module includes a first laser source configured to emit first modulated light, the first modulated light being modulated laser light. The laser sensor module further includes circuitry configured to drive the first laser source with a first modulated driving current to cause the first laser source to emit the modulated laser light, a detector configured to detect the modulated laser light, which induces a photocurrent with variations resulting from modulation of the modulated laser light, and a second laser source configured to emit second modulated light. The circuitry is further configured to drive the second laser source with a second modulated driving current to cause the second laser source to emit the second modulated light. The detector is configured to detect the second modulated light. The circuitry is configured to adapt the amplitude of the second modulated driving current to induce a contribution to the photocurrent.

14 Claims, 4 Drawing Sheets

(56) References Cited

U.S. PATENT DOCUMENTS

| | | | |
|---|---|---|---|
| 2007/0127530 A1* | 6/2007 | Pan ..................... | H01S 5/06832 |
| | | | 372/38.01 |
| 2017/0207856 A1* | 7/2017 | Blumkin .............. | H04B 10/503 |
| 2018/0006428 A1 | 1/2018 | Debregeas et al. | |
| 2019/0317639 A1 | 10/2019 | Winkler et al. | |
| 2020/0200522 A1 | 6/2020 | Huang et al. | |

* cited by examiner

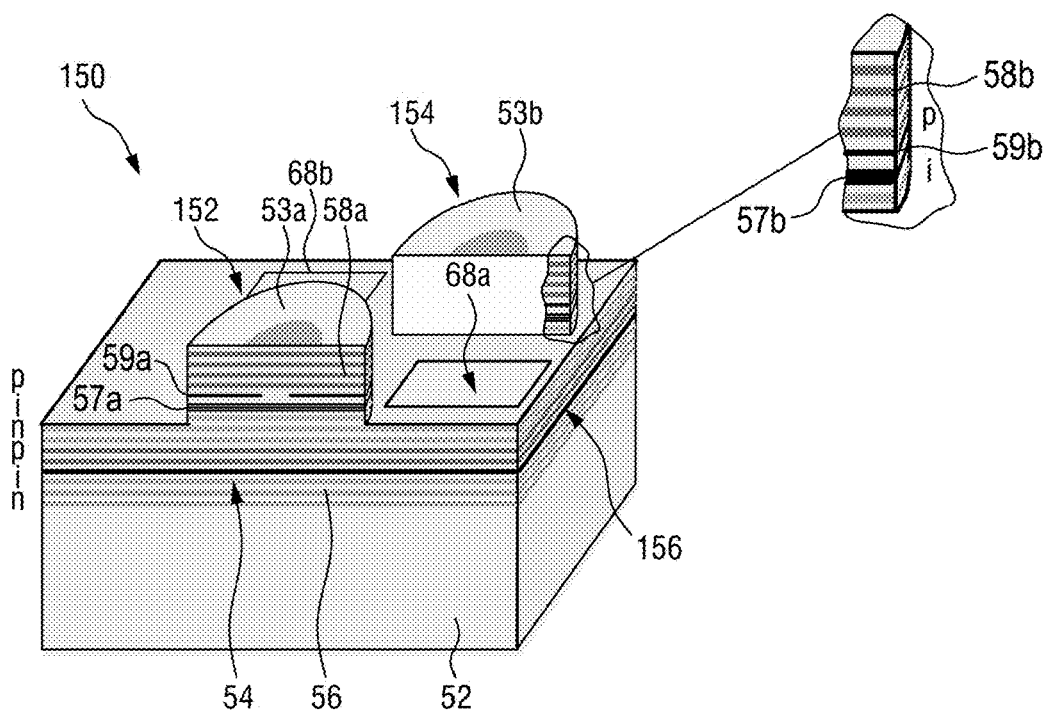
Fig. 1
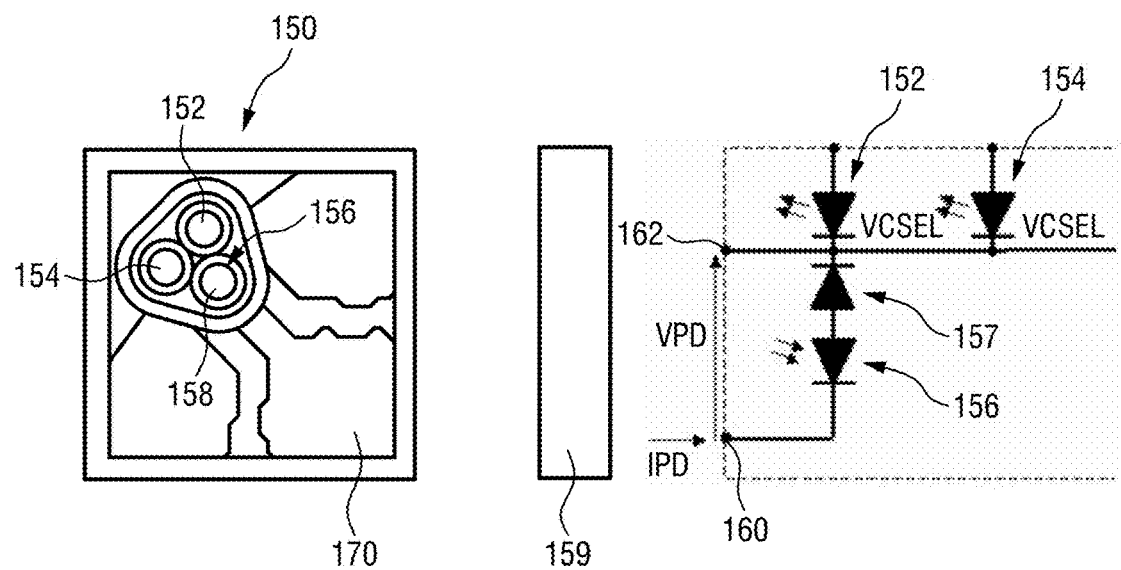
Fig. 2
Fig. 3

LASER SENSOR MODULE FOR SELF-MIXING INTERFEROMETRY

CROSS REFERENCE TO RELATED APPLICATIONS

This application claims benefit to European Patent Application No. EP 20196234.7, filed on Sep. 15, 2020, which is hereby incorporated by reference herein.

FIELD

The present disclosure relates to a laser sensor module with at least two laser sources. The present disclosure further relates to a device, in particular to a detector device or a mobile communication device comprising such a laser sensor module. The present disclosure further relates to a corresponding method, and a corresponding computer program.

BACKGROUND

Laser devices based on laser diodes are attractive for optical sensing applications. Especially VCSELs as a specific kind of laser diodes, where the laser beam emission is perpendicular to the wafer surface, are in combination with integrated photodiodes (VIPs) even more attractive components as they provide light source and detector in one package. Optical sensing applications using laser devices based on VCSELs with integrated photodiode (VIPs) are, for example, sensing of particles, sensing of distance, sensing of velocity, etc. Laser devices based on VCSELs are advantageous due to low cost, low power consumption, high sensitivity, small footprint, self-aligned optical path, etc.

A well-known technique used for said purpose of sensing is self-mixing interferometry, where a detector, such as a photodiode, is positioned behind a laser or may be part of the laser structure itself. In a general self-mixing interference system, a lens is placed in front of the laser, the laser beam hits an object of which, e.g., the velocity needs to be determined, and light reflected from the object is interfering in the laser. This results in intensity variations that are sensed by a detector.

For many applications, a modulated laser current is required as this results in wavelength variations which are then used for improved detection of distances and/or absolute velocities.

The use of a modulated laser current, however, leads to some drawbacks as the intensity variations of the light emitted by the laser source and detected by the detector lead to variations of the photocurrent, which are large compared to the magnitude of the self-mixed interference signal. This may lead to several problems, such as clipping of the photodiode signals in the front-end electronic. These problems may be solved by providing special electronic provisions to compensate these variations in the photocurrent, but these provisions are elaborate, not trivial to implement and the variations can often not be significantly reduced.

Thus, there is a need for a laser sensor module, which is efficiently able to handle the problems arising in the detector from the large intensity variations of the emitted light.

SUMMARY

In an embodiment, the present disclosure provides a laser sensor module. The laser sensor module includes a first laser source configured to emit first modulated light, the first modulated light being modulated laser light. The laser sensor module further includes circuitry configured to drive the first laser source with a first modulated driving current to cause the first laser source to emit the modulated laser light, a detector configured to detect the modulated laser light, which induces a photocurrent with variations resulting from modulation of the modulated laser light, and a second laser source configured to emit second modulated light. The circuitry is further configured to drive the second laser source with a second modulated driving current to cause the second laser source to emit the second modulated light. The detector is configured to detect the second modulated light. The circuitry is configured to adapt the amplitude of the second modulated driving current to induce a contribution to the photocurrent which compensates for the variations of the photocurrent induced by the modulated laser light of the first laser source.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 1 shows an embodiment of a laser sensor module comprising two laser diodes with an integrated photodiode in a schematic cross-section;

FIG. 2 shows a top view of a laser sensor module formed on a chip;

FIG. 3 shows a connection scheme of the connection between the two laser diodes and the photodiode of FIG. 2;

DETAILED DESCRIPTION

Figure 4:
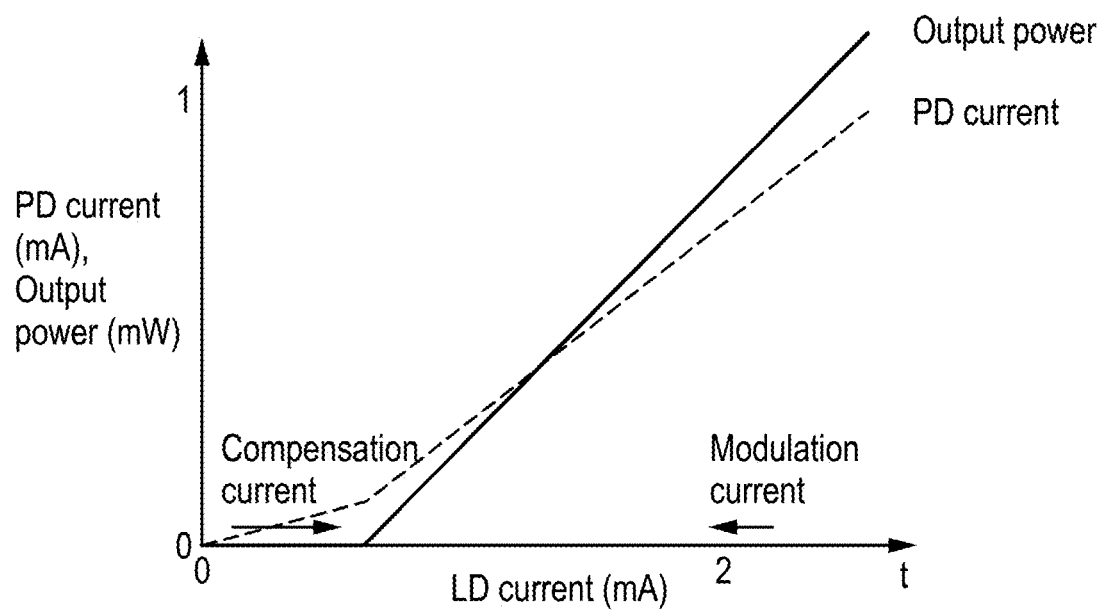
FIG. 4 shows a diagram illustrating a typical photodiode current and laser output power as a function of a laser diode current.

The present disclosure provides for prevention of large intensity variations in a detector of a laser sensor module, while still being able to change the wavelength of the measurement beam emitted by a laser source.

In a first aspect, the present disclosure provides a laser sensor module that comprises: a first laser source configured to emit modulated laser light, a circuitry configured to drive the first laser source with a first modulated driving current to cause the first laser source to emit modulated laser light, and a detector configured to detect said modulated laser light which induces a photocurrent with variations resulting from the modulation of said modulated laser light, wherein the laser sensor module further comprises a second laser source configured to emit modulated light, wherein the circuitry is configured to drive the second laser source with a second modulated driving current to cause the second laser source to emit modulated light, and the detector is configured to detect said modulated light, wherein the circuitry is configured to adapt the amplitude of the second modulated driving current to induce a contribution to the photocurrent which compensates for the variations of the photocurrent induced by the laser light of the first laser source.

In a further aspect of the present disclosure, a device comprising the laser sensor module is presented. Such a device may in particular be a detector device or a mobile communication device comprising said laser sensor module.

In yet further aspects, there are provided a corresponding method, a computer program which comprises program code means for causing the laser sensor module or the device to perform the steps of the method disclosed herein when said computer program is carried out on a processor of the laser sensor module or on a processor of the device, as well as a non-transitory computer-readable recording medium that stores therein a computer program product, which, when executed by a processor, causes the method disclosed herein to be performed.

The present disclosure is based on the idea to not only use one laser source and a detector, which is configured to detect the light emitted by the laser source, but further a second laser source, wherein photocurrent variations originating from the modulated light from the first laser source are compensated by the additional contribution to said photocurrent induced by the modulated light emitted by the second laser source, and vice versa.

For said purpose, the circuitry adapts, based on the detected modulated laser light emitted by the first laser source, the amplitude of the second modulated driving current (used for driving the second laser source) to induce a contribution to the photocurrent in the detector, which contribution compensates for the variations of the photocurrent caused by the modulated laser light emitted by the first laser.

It shall be understood that it is equivalent to adapt the amplitude of the first modulated driving current (used for driving the first laser source) to induce a contribution to the photocurrent which is induced in the detector based on the detected modulated light emitted by the second laser in order to compensate for the variations of the photocurrent.

It shall be further noted that when the first laser source emits laser light, i.e., the first laser source is operated in a lasing mode, the second laser source is not necessarily operated in the lasing mode. This means that the second laser source may either emit laser light by being operated in a lasing mode, or non-coherent, divergent light by being operated in a non-lasing mode. Said aspect is further elucidated later with reference to further embodiments. However, it shall already be noted that it is essential that at least one laser source is operating in a lasing mode to emit laser light for the purpose of self-mixing interference.

It shall be further understood that the present disclosure is based on using at least two laser sources, while two laser sources shall be considered as being the smallest possible number of laser sources used. It may for sure be a viable option to use even more laser sources.

In the present description, the term "laser source" encompasses one light emitting element or light emitting part, such as a mesa of a VCSEL. The first laser source and the second laser source (two mesas) may be arranged on a common chip. For example, in case of VCSELs, two mesas on a common chip may be denoted as two VCSELs in the present description. The laser sources may be configured to emit radiation in a spectral range from 700 nm to 1600 nm. Thus, in general, the laser sources may be configured to emit electromagnetic radiation in the red or infrared spectral range which enables using the laser sensor module for various applications and is of particular interest for distance and/or velocity measurement applications.

Preferably, the circuitry may be configured to determine the first modulated driving current and the second modulated driving current based on the measured photocurrent of the detector. Hence, the circuitry is electrically connected to the detector and the laser sources to adjust the driving current of the laser sources based on the photocurrent of the detector.

According to an embodiment, the circuitry may be configured to provide the first modulated driving current (of the first laser source) and the second modulated driving current (of the second laser source), wherein both driving currents, i.e., the first and second modulated driving current, vary over a predetermined time period according to a wave form.

Hence, the first modulated driving current and the second modulated driving current may be modulated such that these currents have the shape of a sine or cosine waveform, for example.

Preferably, the circuitry is configured to drive the first laser source and the second laser source with current amplitudes that are in antiphase with respect to each other. Thus, the first modulated driving current may be modulated by a first sine wave, while the second modulated driving current may be modulated by a second sine wave shifted by 180° with respect to the first sine wave. Thus, the light emitted by the first laser source and the second laser source as well as the photocurrent induced based on the detection of said modulated light is also modulated accordingly.

This provides the technical effect that the variations of the second photocurrent compensate for the variations of the first photocurrent, and vice versa.

Apart from modulating the current amplitudes by trigonometrical functions, they may also be modulated by a triangular laser current modulation. Using such a modulation enables, by the compensation discussed above, to cancel the triangular photocurrent induced in the detector.

The first laser source, the second laser source and the detector may be arranged on a common chip. In the case where the detector is a photodiode and the laser sources are laser diodes, such as VCSELs, the photodiode may also be integrated in at least one laser diode, preferably in both. According to said configuration, the photodiode may be arranged external to an optical resonator of the at least one laser diode or the photodiode may be arranged internal to an optical resonator of the at least one laser diode. Subject matter of the present disclosure is particularly advantageous if the photodiode is integrated in the laser diode, be it in the optical resonator or external to the optical resonator of the laser diode.

According to an embodiment, the variations of the amplitude of the first driving current and of the amplitude of the second driving current are in a range from 0.05 mA to 0.5 mA. This range typically allows decent wavelength variations for detecting the distance and/or the velocity of an object. Apart from that, these variations are not too large and can be efficiently compensated in the detected photocurrent.

Preferably, the first laser source and the second laser source are operated with a driving current with an amplitude in a range from 0.05 mA to 2 mA. Thus, it may be an option to operate, e.g., the first laser diode with a first DC driving current amplitude of 1.5 mA and AC variations of the amplitude of about 0.2 mA to operate the first laser source in a range from 1.4 mA to 1.6 mA. This range is typically above the threshold operating current amplitude of a typical VCSEL used. Thus, said first laser source may be operated to emit laser light in a lasing mode. The second laser source may then, e.g., be operated with a second DC driving current amplitude of about 0.3 mA and AC variations of the amplitude of about 0.4 mA to operate the second laser source in a range from 0.1 mA to 0.5 mA which is typically below the threshold operating current amplitude of a typical VCSEL used.

These values are only exemplarily, but preferably the variations of the amplitude of the first driving current and of the amplitude of the second driving current are substantially the same. If the variations of the amplitudes are strongly different, the effect of compensation for the variations of the photocurrent cannot be efficiently achieved. Different DC driving current amplitudes are preferably used for the first laser source and the second laser source if one of the laser sources is operated with a driving current below threshold, because the slope of the photodiode current below said threshold is substantially lower than the slope of the photodiode current above said threshold.

In general, the circuitry may also be configured to vary the intensity and/or the wavelength of the light emitted by the first laser source and the second laser source differently to obtain different emitted wavelengths and different output powers of the two laser sources.

As already explained above, it is important for the self-mixing interferometry that at least one laser source is operated in a lasing mode. The presented concept of compensating for the large variations of the photocurrent also works if only one of the laser sources operates in a lasing mode. Thus, according to an embodiment, the circuitry may be configured to drive the first laser source with a first driving current amplitude which is larger than a threshold operating current amplitude of said laser and the second laser source with a second laser current amplitude which is smaller than the threshold operating current amplitude of said second laser source. However, even though this configuration is a viable option, for many applications it will be more desirable if both laser current amplitudes are larger than a respective threshold operating current amplitude of the respective laser diode to operate both laser sources in a lasing mode with a coherent, narrow beam light emission. For example, this will be accomplished by driving both lasers sources with a DC current amplitude of 1.5 mA and AC variations of the amplitude of 0.2 mA. The modulation signal on both laser sources will be in counterphase to achieve the compensation.

It shall be understood that a preferred embodiment can also be any combination of the dependent claims with the respective independent claim.

Further advantageous embodiments are described below.

FIG. 1 shows an embodiment of a laser sensor module 150 comprising two laser diodes 152, 154 with an integrated photodiode 156 in a schematic cross section.

In the following, the detector of is referred to as "photodiode" and the laser sources are referred to as "laser diodes".

The laser sensor module 150 comprises a first laser diode 152 and a second laser diode 154. These laser diodes 152, 154 may be each configured as a vertical cavity surface emitting laser (VCSEL). The VCSELs may have a mesa structure 53a, 53b as known in the art. The VCSELs may be configured to have a common optical resonator cavity 54 including a lower distributed Bragg reflector (DBR) 56 and an upper DBR 58a, 58b. The reflectors 56 and 58a, 58b form the respective optical resonator cavity 54 of the first laser diode 152 and the second laser diode 154. According to the embodiment shown in FIG. 1, the lower distributed Bragg reflector 56 is shared by the first laser diode 152 and the second laser diode 154. A laser active quantum well layer 57a, 57b and a current confinement layer 59a, 59b may be arranged between the lower and upper DBRs as known in the art.

The laser sensor module 150 further comprises a photodiode 156. In this embodiment. The photodiode 156 is integrated in the optical resonator cavity 54 of the laser diode 152, 154. In the present embodiment, the photodiode 156 is integrated into a lower DBR of the laser diodes which further include the upper DBRs 58a, 58b and laser active medium having quantum wells between the DBRs. Integration of the photodiode 156 into the lower DBR 56 may be accomplished as follows. The lower DBR 56 may consist of three areas, starting below the laser active medium with n-doped layers, changing to p-doped layers followed by an intrinsic absorption layer of the photodiode 156 placed around an antinode of the standing wave pattern in order to get maximum responsibility and maximum contrast of stimulated versus spontaneous emission of the laser diodes 152, 154. The p-i-n-structure of the photodiode 156 is finished by further n-doped layers. An intra-resonator cavity contact 68a, 68b in the central n-doped DBR part is used as both, VCSEL cathode and photodiode anode. According to the embodiment shown, a first intra-resonator cavity contact 68a is implemented for the first laser diode 152 and a second intra-resonator cavity contact 68b is implemented for the second laser diode 154.

It should be noted that the embodiment shown in FIG. 1 is only exemplarily. In particular, the laser sensor module 150 may be modified, e.g., by integrating the photodiode 156 into the laser diodes 152, 154 between the lower DBR and a substrate 52 to form a photodiode, which is external to the optical resonator cavity 54. In difference to such a laser diode with an external photodetector, the embodiment shown in FIG. 1 with an internal photodetector is not only sensitive to stimulated emission of radiation emitted by the laser diodes (laser light), but is also sensitive to spontaneous emission of radiation emitted by the laser diodes (LED light). As it is a viable option to operate one laser diode in the lasing mode, and the other laser diode in a non-lasing mode, the embodiment of a laser sensor module 150 as shown in FIG. 1 with an internal photodetector may be favored.

Apart from the components of the laser sensor module 150 shown in FIG. 1, the laser sensor module 150 further comprises a circuitry, which is not shown in FIG. 1 and is explained in the following with reference to FIGS. 2 and 3.

FIG. 2 shows a top view of a laser sensor module 150 formed on a chip and FIG. 3 shows a connection scheme of the connection between the two laser diodes and the photodiode of FIG. 2. The laser sensor module 150 may be the same as shown in FIG. 1.

The laser sensor module 150 comprises two laser diodes 152, 154 each configured as a VCSEL. Each VCSEL has a mesa structure as described already with reference to FIG. 1. Thus, the laser sensor module 150 may also be denoted as a laser device having two mesas. The VCSELs 152, 154 are arranged on a common chip 170. The laser sensor module 150 further comprises a single photodiode 156 and an electric contact 158 of which can be seen in FIG. 2 only. The single photodiode 156 may be integrated into both laser diodes 152, 154, either external to the resonator cavities or within the resonator cavities. The photodiode 156 receives radiation from both laser diodes 152, 154 individually.

FIG. 3 shows a connection scheme of the electrical connection between the two laser diodes 152, 154 and the photodiode 156. Apart from these components, the laser sensor module 150 further comprises a circuitry 159. The circuitry 159 is configured to control the laser diodes 152, 154 and the photodiode 156 and to measure photodiode currents in the photodiode 156 for a number of laser diode driving currents in the laser diodes 152, 154. VPD denotes the photodiode voltage between the photodiode cathode 160 and a contact 162, the latter being on the same potential as the cathodes of the laser diodes 152, 154. Further, the contact 162 is on the same potential as a cathode of an additional forward biased diode 157 which serves to contact the anode layer of the photodiode 156. IPD denotes the photodiode current which may be measured by the circuitry 159 in dependence on the radiation emitted by the laser diodes 152, 154 and received by the photodiode 156. It is to be understood that more than two laser diodes may be integrated in the laser sensor module 150.

The circuitry 159 may be configured to set and determine the driving current for each of the laser diodes 152, 154 individually and/or alternatingly by using the measured photodiode current of the common photodiode 156. According to the principles of the present disclosure, the circuitry 159 is configured to drive the first laser diode 152 with a first modulated driving current to cause the first laser diode 152 to emit modulated laser light. The photodiode 156 is configured to detect said modulated laser light which induces a photocurrent with variations resulting from the modulation of said modulated laser light. Further, the circuitry 159 is configured to drive the second laser diode 154 with a second modulated driving current to cause said second laser diode 154 to emit modulated light which is detected by the photodiode 156 as well. This modulated light of the second laser diode 154 contributes to the photocurrent. According to the principles of the present disclosure, the circuitry 159 adapts the amplitude of the second modulated driving current to induce such a contribution by the modulated light of the second laser diode 154 to the photocurrent that said contribution compensates for variations of the photocurrent caused by the modulated laser light emitted by the first laser diode 152. Thus, the photocurrent variations originating from the first laser diode 152 are compensated by the photocurrent variations originating from the second laser diode 154.

FIG. 4 shows a diagram illustrating a typical photodiode current and laser output power as a function of a laser diode current. It can be clearly seen that a larger driving current of a laser diode leads to a larger output power of the emitted light, which induces a larger photocurrent in the photodiode. A modulation of the driving current of a laser diode directly leads to a modulation of the output power of the emitted light, which induces a photocurrent with variations in the photodiode.

Figure 5:
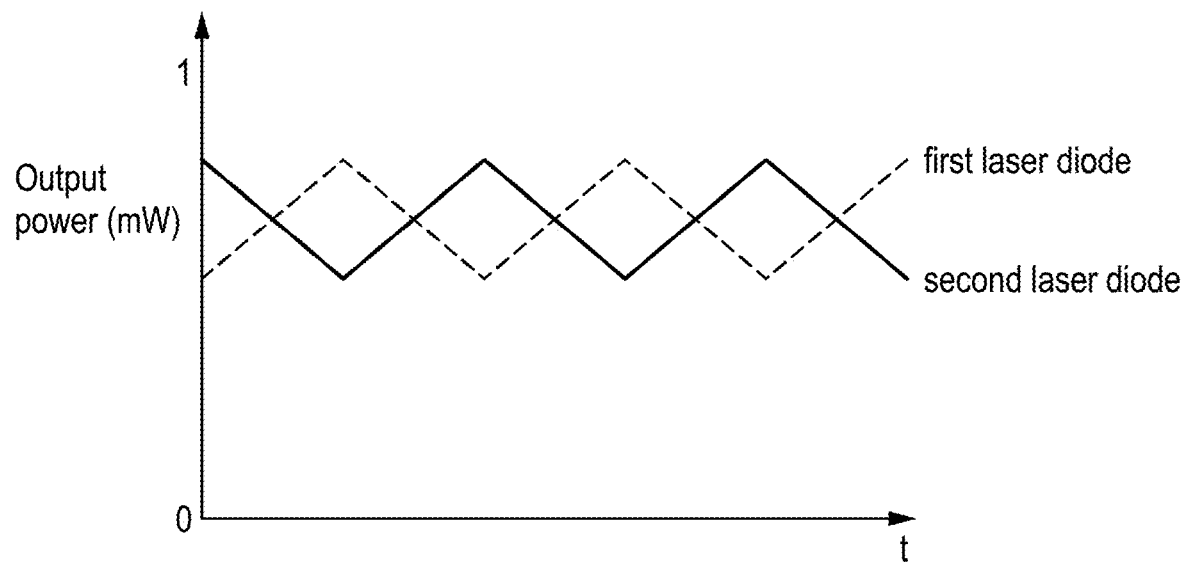
FIG. 5 shows a diagram illustrating a modulation of the output power of two laser sources operated by modulated driving currents which are in antiphase with respect to each other.

In case of triangular laser modulation of the laser diodes (as also illustrated in FIG. 5), the laser current may for instance decrease from 2.2 mA to 2.0 mA as indicated by the modulation current arrow in FIG. 4. This results in, e.g., 0.1 mA undesired photocurrent decrease. In order to compensate this photocurrent variation, an increasing laser driving current from, e.g., 0.1 mA to 0.5 mA can be used for the other laser diode as indicated by the compensation current arrow in FIG. 4. This results in a 0.1 mA photocurrent decrease, thereby cancelling the undesired photocurrent variation. Because the second laser diode is still operated below threshold, this hardly has influence on additional laser output power from the second laser source.

FIG. 5 shows a diagram illustrating a modulation of the output power of two laser sources operated by modulated driving currents which are in antiphase with respect to each other. Exemplarily, the first laser diode and the second laser diode are driven with a triangular laser current modulation. This leads, as already explained above with reference to FIG. 4, to a triangular modulation of the output power of the emitted light of laser diodes. As the value of the output power of the first laser diode and the second laser diode are in antiphase with respect to each other, a total photocurrent is induced in the detector which does not comprise any variations.

Figure 6:
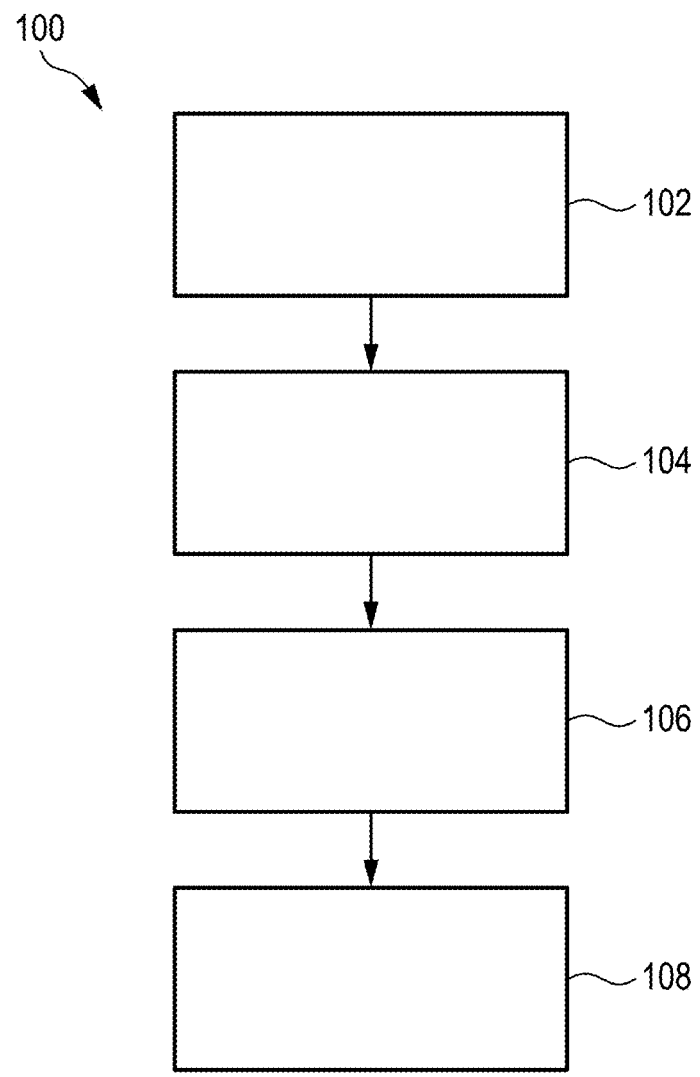
FIG. 6 shows a flowchart illustrating a method for compensating for the variations of the photocurrent of the detector of the laser sensor module as shown in FIGS. 1-3.

FIG. 6 shows a flowchart illustrating a method 100 for compensating for the variations of the photocurrent of the detector 156 of the laser sensor module 150 described above with reference to FIGS. 1-3.

In step 102, the first laser source 152 is driven with a first modulated driving current to cause said first laser source 152 to emit modulated laser light. In step 104, said modulated laser light is detected by the detector 156 and induces a photocurrent with variations resulting from the modulation of said modulated laser light. In step 106, the second laser source 154 is driven with a second modulated driving current to cause said second laser source 154 to emit modulated light. In step 108, said modulated light emitted by the second laser source 154 is detected by the detector 156, wherein the amplitude of the second modulated driving current is adapted to induce a contribution to the photocurrent which compensates for the variations of the photocurrent caused by the laser light emitted by the first laser source 152. Thus, preferably a photocurrent without any variations, i.e., a current with only a DC component and with no AC component is obtained. It shall be understood that the order of the steps shown in FIG. 6 is only exemplarily and all these steps shall be considered as being equivalent.

Figure 7:
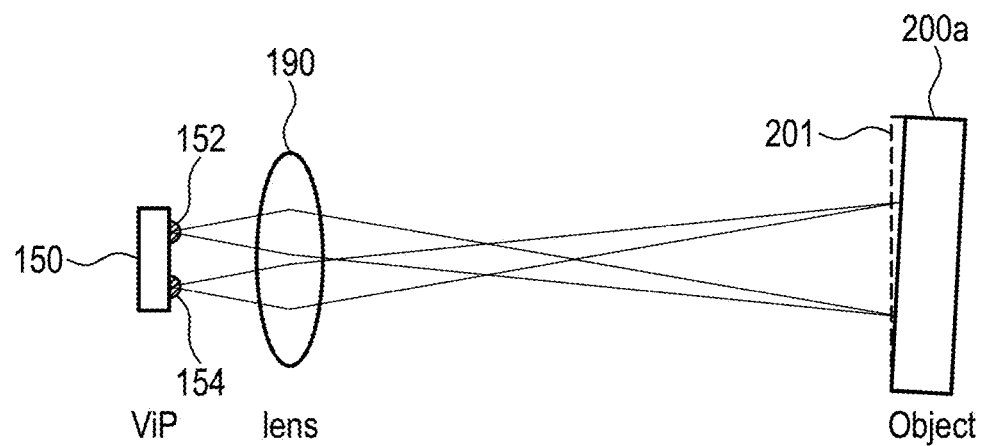
FIG. 7 shows a schematic diagram of a setup using a lens in front of a laser sensor module to measure a tilt of an object.

FIG. 7 shows a schematic diagram of a setup using a lens 190 in front of the laser sensor module 150 to measure a tilt 201 of an object 200a. The setup shows exemplarily one SMI application where a modulated laser current is required as using a DC laser current does not allow measuring absolute velocities and/or distances of objects.

The laser sensor module 150 comprises again VCSELs with integrated photodiode (VIPs) and the direction of the light emitted by the first laser source 152 is tilted with respect to the light emitted by the second laser source 154 by placing a lens 190 in front of the laser sensor module 150. It shall be understood that the lens 190 may also be directly attached to at least one of the first laser source 152 and the second laser source 154 to tilt the direction of the light emitted by the first laser source 152 with respect to the laser light emitted by the second laser source 154. This may be achieved by any suitable technique known in the art, such as lithography. To measure the tilt 201 of the object 200a as shown in FIG. 7, both laser sources 152, 154 are operated in a lasing mode. Hence, the first laser source 152 and the second laser source 154 of the laser sensor module 150 are both driven with a modulated driving current which is larger than the respective operating threshold values of the first laser source 152 and the second laser source 154.

Both laser beams hit the object 200a and the light reflected from the object 200a is interfering in the laser resulting in a self-mixing interferometry (SMI) signal, which is then detected by the detector 156 of the laser sensor module 150. The small SMI signals can be detected using a trans-impedance amplifier (TIA). The typical resistance values of such a TIA are in the order of 1 MΩ. Normally additional circuitry would be required to cancel the triangular modulation pattern as shown in FIG. 5, but due to the cancellation method as described above with reference to FIG. 6, no additional circuitry is required. The distances from the first laser source 152 and the second laser source 154 to the object 200a can be derived and the tilt 201 of the object 200a can be measured by a comparison of the distances.

If for a distance measurement an increased detection range is further required, it is favorable to additionally use two different aperture sizes for the first laser source 152 and the second laser source 154 (not shown). Thus, the dλ/dI parameter (also known as slope efficiency) can be adapted, wherein λ is the respective wavelength of the emitted light of one laser source and I is the intensity of the emitted light. By adapting this parameter, the detected Doppler frequency for the first laser source 152 and the second laser source 154 is different. These different Doppler frequencies can both be detected by the detector 156 of the laser sensor module 150. Because of the difference in Doppler frequencies, one laser source can be used for an object nearby and the other laser source can be used when the object is further away.

Figure 8:
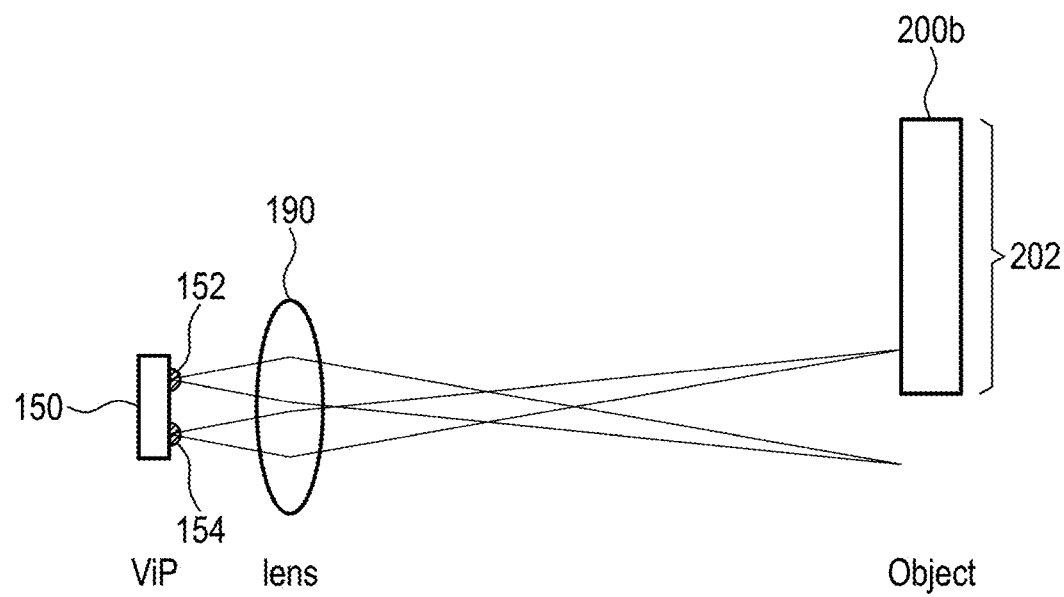
FIG. 8 shows a schematic diagram of the setup shown in FIG. 7 for measuring a width of an object.

FIG. 8 shows a schematic diagram of the setup shown in FIG. 7 for measuring a width 202 of an object 200b. In this case, the laser sensor module is used to check for instance in a production line if the width 202 of an object 200b has the desired size. The setup shows exemplarily another SMI application where a modulated laser current is required. The laser sensor module may be same as shown in FIG. 7. The first laser source 152 and the second laser source 154 emit laser light. The object may be moved along at least one direction to multiple different positions. Depending on the position of the object 200b, either both laser beams, only one laser beam emitted by either the first laser source 152 or the second laser source 154, or none of the laser beams hit the object 200a. The light reflected from the object 200b interferes again in the laser resulting in a self-mixing interferometry (SMI) signal, which is then detected by the detector 156 of the laser sensor module 150. Measuring at various different positions allows estimating the width 202 of the object 200b as depending on the position of the object 200b, either both laser beams, one laser beam or no laser beam is reflected.

A computer program may be stored/distributed on a suitable non-transitory medium, such as an optical storage medium or a solid-state medium supplied together with or as part of other hardware, but may also be distributed in other forms, such as via the Internet or other wired or wireless telecommunication systems.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A laser sensor module, comprising:
   a first laser source configured to emit first modulated light, the first modulated light being modulated laser light;
   circuitry configured to drive the first laser source with a first modulated driving current to cause the first laser source to emit the modulated laser light; and
   a detector configured to detect the modulated laser light, which induces a photocurrent with variations resulting from modulation of the modulated laser light; and
   a second laser source configured to emit second modulated light,
   wherein the circuitry is further configured to drive the second laser source with a second modulated driving current to cause the second laser source to emit the second modulated light,
   wherein the detector is configured to detect the second modulated light, and
   wherein the circuitry is configured to adapt the amplitude of the second modulated driving current to induce a contribution to the photocurrent which compensates for the variations of the photocurrent induced by the modulated laser light of the first laser source.

2. The laser sensor module according to claim 1, wherein the circuitry is configured to determine the first modulated driving current and the second modulated driving current based on the measured photocurrent of the detector.

3. The laser sensor module according to claim 1, wherein the circuitry is configured to provide the first modulated driving current and the second modulated driving current, and wherein the first modulated driving current and the second modulated driving current both vary over a predetermined time period according to a wave form.

4. The laser sensor module according to claim 1, wherein the circuitry is configured to drive the first laser source and the second laser source with current amplitudes that are in antiphase with respect to each other.

5. The laser sensor module according to claim 1, wherein the circuitry is configured to drive the first laser source and the second laser source with a triangular laser current modulation.

6. The laser sensor module according to claim 1, wherein the first laser source, the second laser source, and the detector are arranged on a common chip, or
   wherein the detector is a photodiode and the first laser source and the second laser source are laser diodes and the photodiode is integrated in at least one laser diode and arranged external to an optical resonator of the at least one laser diode, or
   wherein the photodiode is integrated in the at least one laser diode and arranged internal to an optical resonator of the at least one laser diode.

7. The laser sensor module according to claim 1, wherein the variations of the amplitude of the first driving current and of the amplitude of the second driving current are in a range from 0.05 mA to 0.5 mA.

8. The laser sensor module according to claim 1, wherein the circuitry is configured to vary the intensity and/or the wavelength of the light emitted by the first laser source and the second laser source differently.

9. The laser sensor module according to claim 1, wherein the circuitry is configured to:
drive the first laser source with a first driving current amplitude larger than a threshold operating current amplitude of the first laser source to operate the first laser source in a lasing mode, and
drive the second laser source with a second laser current amplitude smaller than a threshold operating current amplitude of the second laser source to operate the second laser source in a non-lasing mode.

10. The laser sensor module according to claim 1,
wherein the circuitry is configured to drive the first laser source and the second laser source with a first laser current amplitude and a second laser current amplitude which are both larger than a respective threshold operating current amplitude of the first laser source and the second laser source to cause the first laser source and the second laser source to operate in a lasing mode.

11. The laser sensor module according to claim 1, further comprising:
different aperture sizes for the first laser source and the second laser source to adapt the change of wavelength of the emitted laser light with respect to intensity of the emitted laser light for the two laser sources differently,
wherein the detector is configured to detect the modulated laser light emitted by the first laser source and the modulated laser light emitted by the second laser source to detect different Doppler frequencies caused by the different aperture sizes.

12. The laser sensor module according to claim 1, further comprising:
a lens attached to at least one of the first laser source and the second laser source, the lens being configured to tilt the direction of the laser light emitted by the first laser source with respect to the laser light emitted by the second laser source to yield spatially separated beams for measuring a tilt of an object and/or a width of the object.

13. A method for compensating for variations of a photocurrent of a detector of a laser sensor module, the method comprising:
driving a first laser source with a first modulated driving current to cause the first laser source to emit first modulated light, the first modulated light being modulated laser light;
detecting the modulated laser light by the detector, which induces a photocurrent with variations resulting from the modulation of the modulated laser light;
driving a second laser source with a second modulated driving current to cause the second laser source to emit second modulated light;
detecting the second modulated light by the detector; and
adapting the amplitude of the second modulated driving current to induce a contribution to the photocurrent which compensates for the variations of the photocurrent induced by the modulated laser light of the first laser source.

14. A non-transitory computer-readable medium having program code stored thereon, the program code, when executed by a processor, causing the processor to carry out the method of claim 13.

* * * * *